(12) United States Patent
Yang

(10) Patent No.: US 8,780,627 B1
(45) Date of Patent: *Jul. 15, 2014

(54) NON-VOLATILE MEMORY DEVICES HAVING UNIFORM ERROR DISTRIBUTIONS AMONG PAGES

(71) Applicant: Marvell International Ltd., Hamilton (BM)

(72) Inventor: Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/153,987

(22) Filed: Jan. 13, 2014

Related U.S. Application Data

(63) Continuation of application No. 13/724,275, filed on Dec. 21, 2012, now Pat. No. 8,638,604, which is a continuation of application No. 12/842,724, filed on Jul. 23, 2010, now Pat. No. 8,345,477.

(60) Provisional application No. 61/229,681, filed on Jul. 29, 2009.

(51) Int. Cl.
G11C 16/04 (2006.01)

(52) U.S. Cl.
USPC ................................ 365/185.03; 365/185.18

(58) Field of Classification Search
USPC ........................................ 365/185.03, 185.18
See application file for complete search history.

(56) References Cited

U.S. PATENT DOCUMENTS

| | | | |
|---|---|---|---|
| 7,649,793 B1 | 1/2010 | Ramamoorthy et al. | |
| 7,684,255 B2 | 3/2010 | Kim et al. | |
| 7,941,590 B2 | 5/2011 | Yang | |
| 8,023,323 B2 | 9/2011 | Kang et al. | |
| 8,179,719 B1 | 5/2012 | Yang | |
| 8,345,477 B1 | 1/2013 | Yang | |
| 8,638,604 B1 * | 1/2014 | Cheng ..................... | 365/185.03 |
| 2008/0192541 A1 | 8/2008 | Kang et al. | |
| 2009/0003057 A1 | 1/2009 | Kang et al. | |
| 2009/0168543 A1 | 7/2009 | Kim et al. | |
| 2010/0296350 A1 | 11/2010 | Kim et al. | |
| 2012/0198135 A1 | 8/2012 | Chilappagari et al. | |

* cited by examiner

Primary Examiner — Huan Hoang
Assistant Examiner — Jay Radke

(57) ABSTRACT

The present disclosure includes systems and techniques relating to non-volatile memory. A described system, for example, includes a non-volatile memory structure containing a group of memory cells that are programmable based on a group of programming voltages, each of the memory cells being configured to represent two or more bits by a charge level, the two or more bits corresponding to two or more bit positions. The described system includes circuitry configured to monitor read-back data from the non-volatile memory structure, determine estimated mean and standard deviation values of level distributions of the memory cells based on the read-back data, and adjust one or more of the programming voltages based on the estimated mean and standard deviations of the level distribution such that differences among bit error rates of the bit positions are reduced.

26 Claims, 12 Drawing Sheets

NON-VOLATILE MEMORY DEVICES HAVING UNIFORM ERROR DISTRIBUTIONS AMONG PAGES

CROSS REFERENCE TO RELATED APPLICATION

This application is a continuation of and claims the benefit of the priority of U.S. patent application Ser. No. 13/724,275, filed Dec. 21, 2012 and entitled "Non-Volatile Memory Devices Having Uniform Error Distributions Among Pages," which claims the benefit of the priority of U.S. patent application Ser. No. 12/842,724, filed Jul. 23, 2010 and entitled "Non-Volatile Memory Devices Having Uniform Error Distributions Among Pages" (now U.S. Pat. No. 8,345,477), which claims the benefit of the priority of U.S. Provisional Application Ser. No. 61/229,681, filed Jul. 29, 2009 and entitled "Flash Memory Devices Having Uniform Error Distributions Among Pages," the entire contents of the above-identified applications are hereby incorporated by reference.

BACKGROUND

The present disclosure describes systems and techniques relating to non-volatile memory.

Devices and systems can store or retrieve data using non-volatile memory such as flash memory. For example, a digital camera can store an image to a non-volatile memory structure. In another example, a digital media player such as an MP3 player can read a digital audio file from non-volatile memory and play the contents of the audio file. Mobile devices such as a mobile phone or a personal digital assistant (PDA) can read data from and write data to one or more non-volatile memory structures.

Devices and systems can perform multiple operations on non-volatile memory such as reading and programming operations. Various types of programming operations can include writing and erasing data. Erasing data in such memory can include marking a data area as invalid or not programmed. Non-volatile memory such as flash memory can be divided into multiple data areas. Each data area can be individually addressed and accessed. Accordingly, an operation can include obtaining an address for one or more data areas or a portion of a data area. Also, a data area can be divided into individual bits or larger aggregate data units such as bytes.

A non-volatile memory structure can include memory cells such as flash memory cells. Various examples of memory cells include a single level cell (SLC) or a multi-level cell (MLC). Memory cells can store data by trapping granulized amounts of charge in, for example, an isolated region of a transistor. Retrieving data from a memory cell can include applying a read voltage to the transistor and subsequently estimating the readout current which is determined by the amount of charge trapped in the cell.

An example of a type of memory cell is a SLC that can store one bit of information. In such a memory cell, the memory cell can hold or not hold a charge to indicate, for example, logic 1 when a charge is stored, and to indicate logic 0, when no charge is stored.

In contrast, MLCs can store more than one bit of information by taking advantage of the ability of such memory cells to hold varying amounts of charge, e.g., charge levels. For example, suppose the maximum number of trapped charge allowed in a multi-level memory cell is Q. Such a cell can store more than one bit of information based on storing a granulized amount of charge between 0 and Q. A controller can estimate an amount of charge stored during readout of the cell. Thus, for example, two bits of information can be stored in one multi-level memory cell by trapping any one of, for example, four levels of charges: 0, Q/3, 2Q/3, Q. This process of trapping charges can be referred to as programming.

SUMMARY

The present disclosure includes systems and techniques relating to non-volatile memory. According to an aspect of the described systems and techniques, a system includes a non-volatile memory structure that includes memory cells configured to store information based on four or more charge levels associated with four or more states respectively. The four or more states can be indicative of information that includes first bit information in a first bit position and second bit information in a second bit position. The system includes a controller configured to use at least one of four or more programming voltages associated with the four or more states, respectively, to affect a charge of a memory cell. The programming voltages can be selected to reduce differences among bit error rates of individual bit positions in a state determined by reading a charge of a memory cell. The system includes a processing device in communication with the controller. The processing device can be configured to communicate with the non-volatile memory structure via the controller.

In some implementations, the programming voltages are selected such that at least two or more crossing-over probabilities of neighboring states are different. In some implementations, the first bit position is associated with a first physical page and the second bit position is associated with a second physical page. In some implementations, the programming voltages are selected to reduce differences among bit error rates of the physical pages, respectively. In some implementations, the states are arranged in an ordering where information represented by each of the states differs by a single bit position with information represented by an adjacent state. A system can include a module configured to determine estimated mean and standard deviation values of level distributions of the memory cells, and adjust one or more of the programming voltages based on the estimated mean and standard deviation values. A system can include a memory to store one or more of the programming voltages. A system can include a flash memory integrated circuit that includes the non-volatile memory structure. In some implementations, a flash memory integrated circuit includes at least a portion of a controller.

According to another aspect of the described systems and techniques, a method includes receiving data to store in at least a memory cell that is configured to store information based on four or more charge levels associated with four or more states respectively. The four or more states can be indicative of information that includes first bit information in a first bit position and second bit information in a second bit position. The method includes identifying a state of the four or more states based on at least a portion of the received data. The method includes identifying a programming voltage based on the identified state and programming voltage information. The information can include four or more programming voltages associated with the four or more states, respectively. The programming voltages can be selected to reduce differences among bit error rates of individual bit positions in a state determined by reading a charge of the memory cell. The method includes using the identified programming voltage to affect a charge of the memory cell.

In some implementations, using the identified programming voltage can include controlling a flash memory cell. A method can include selecting one or more of the programming voltages such that two or more crossing-over probabilities of neighboring states are different. In some implementations, the first bit position is associated with a first physical page and the second bit position is associated with a second physical page. In some implementations, programming voltages are selected to reduce differences among bit error rates of the physical pages, respectively. In some implementations, the states are arranged in an ordering where information represented by each of the states differs by a single bit position with information represented by an adjacent state. A method can include determining estimated mean and standard deviation values of level distributions of multiple memory cells. A method can include adjusting one or more of the programming voltages based on the estimated mean and standard deviation values. A method can include accessing a value from a memory that stores one or more of the programming voltages. In some implementations, identifying a programming voltage can include using a programming voltage indicated by the value. Identifying a programming voltage can include selecting a programming voltage, that when used, maintains the memory cell in an erase state.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, an apparatus can include multiple memory cells, where a memory cell is configured to store information based on four or more charge levels associated with four or more states, respectively. The four or more states can be indicative of information that includes first bit information in a first bit position and second bit information in a second bit position. The apparatus can include circuitry configured to use at least one of four or more programming voltages associated with the four or more states, respectively, to affect a charge of the memory cell. The programming voltages can be selected to reduce differences among bit error rates of individual bit positions in a state determined by reading a charge of the memory cell.

In some implementations, the programming voltages are selected such that at least two or more crossing-over probabilities of neighboring states are different. In some implementations, the first bit position is associated with a first physical page and the second bit position is associated with a second physical page. In some implementations, the programming voltages are selected to reduce differences among bit error rates of the physical pages, respectively. In some implementations, the states are arranged in an ordering where information represented by each of the states differs by a single bit position with information represented by an adjacent state. An apparatus can include circuitry to determine estimated mean and standard deviation values of level distributions of one or more memory cells. An apparatus can include circuitry to adjust one or more of the programming voltages based on the estimated mean and standard deviation values. An apparatus can include a memory to store one or more of the programming voltages. In some implementations, a memory cell includes a flash memory cell. In some implementations, the four or more programming voltages includes a static programming voltage, that when used, maintains the memory cell in an erase state.

Details of one or more implementations are set forth in the accompanying drawings and the description below. Other features, objects, and advantages may be apparent from the description and drawings, and from the claims.

DRAWING DESCRIPTIONS

Figure 7:
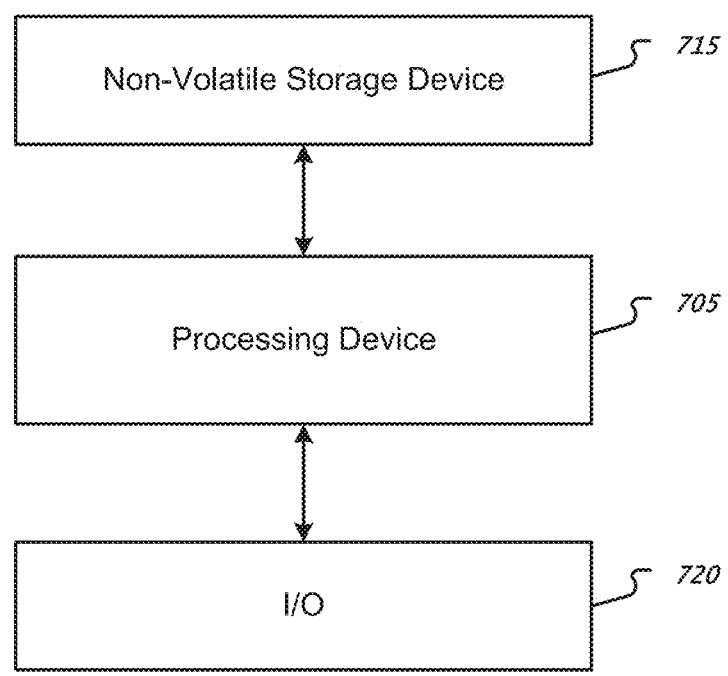
Figure 8:
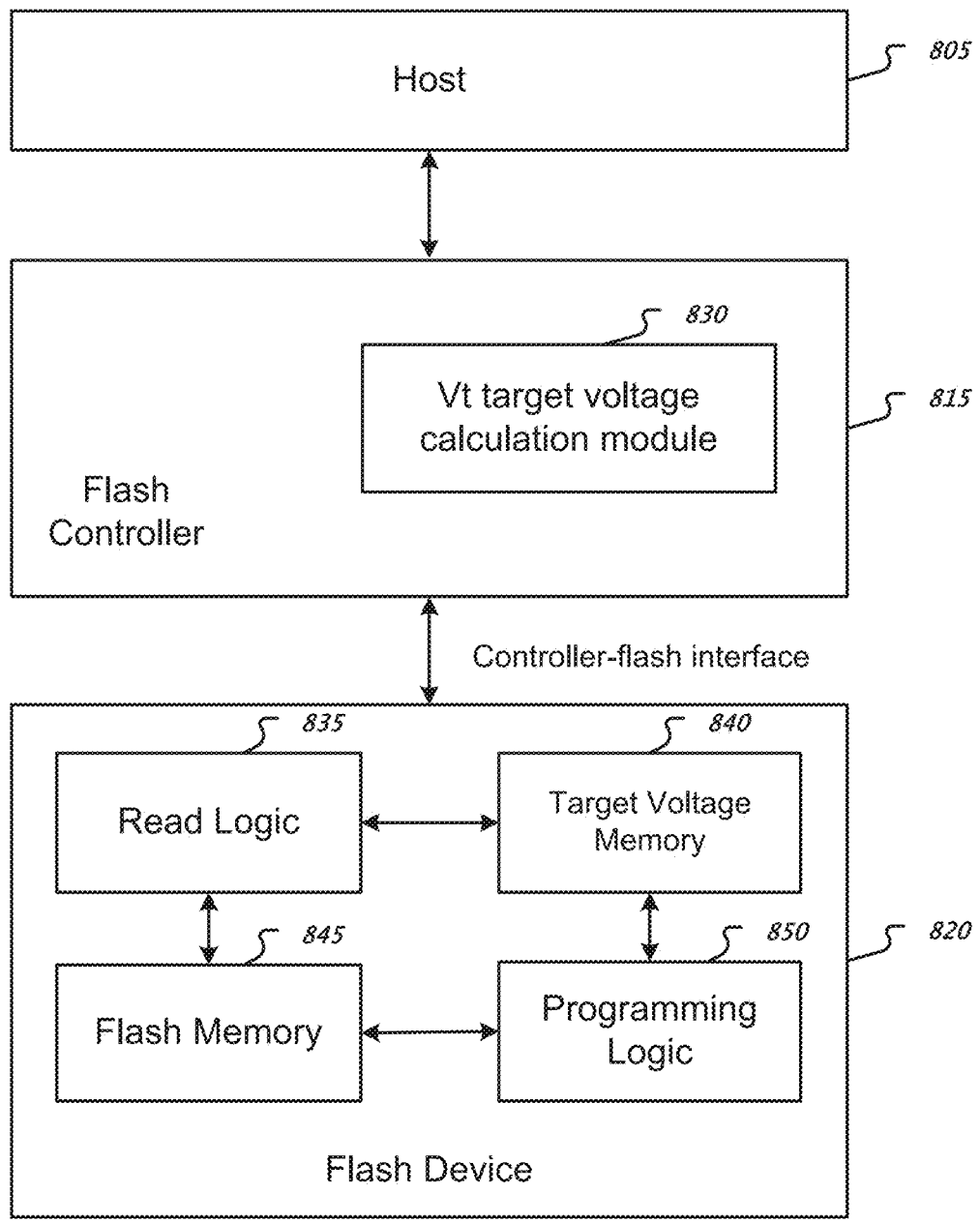
Figure 9:
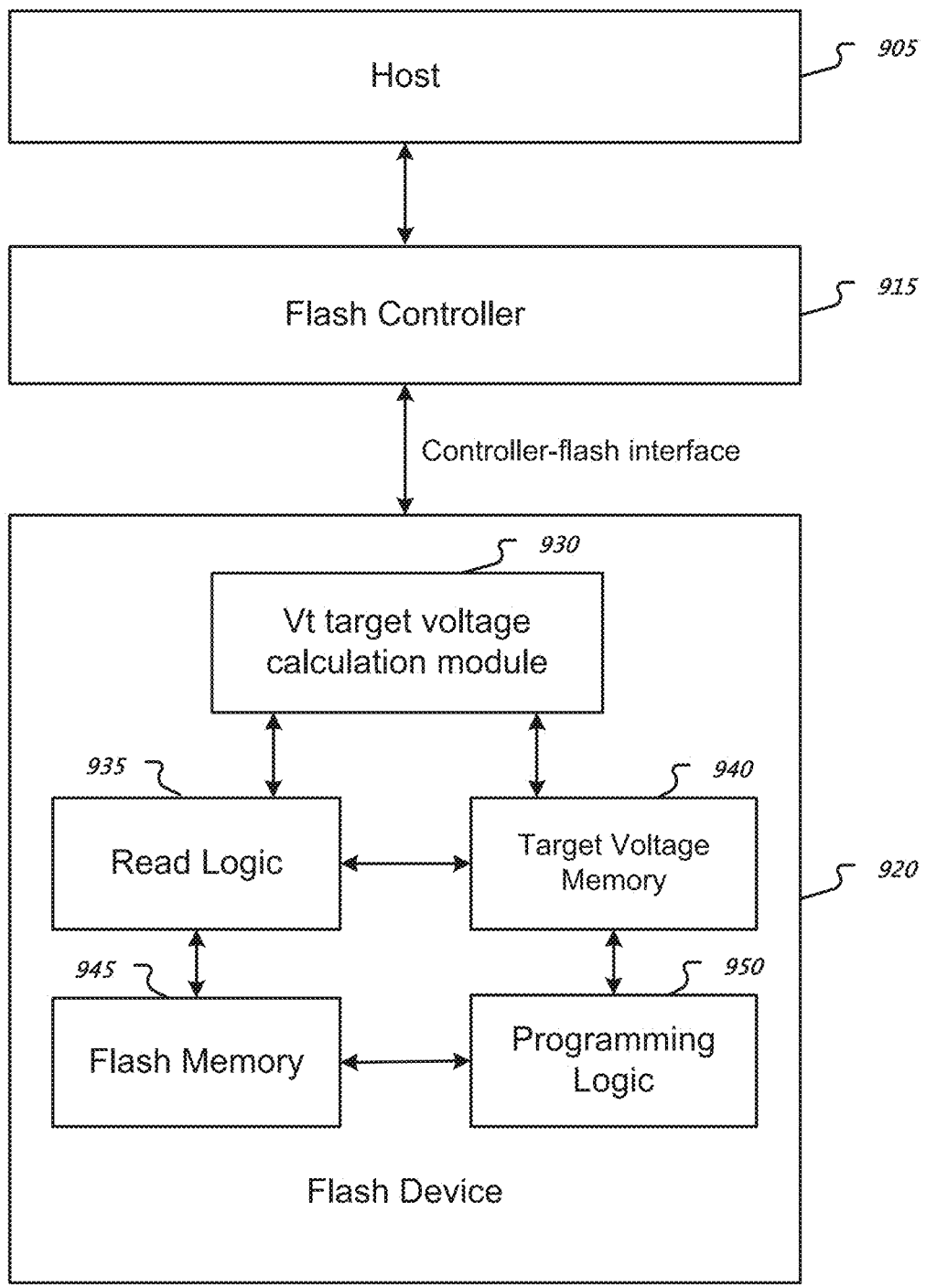

FIGS. 7, 8, and 9 show different examples of a system with non-volatile memory that can perform one or more techniques described herein.

Figure 10:
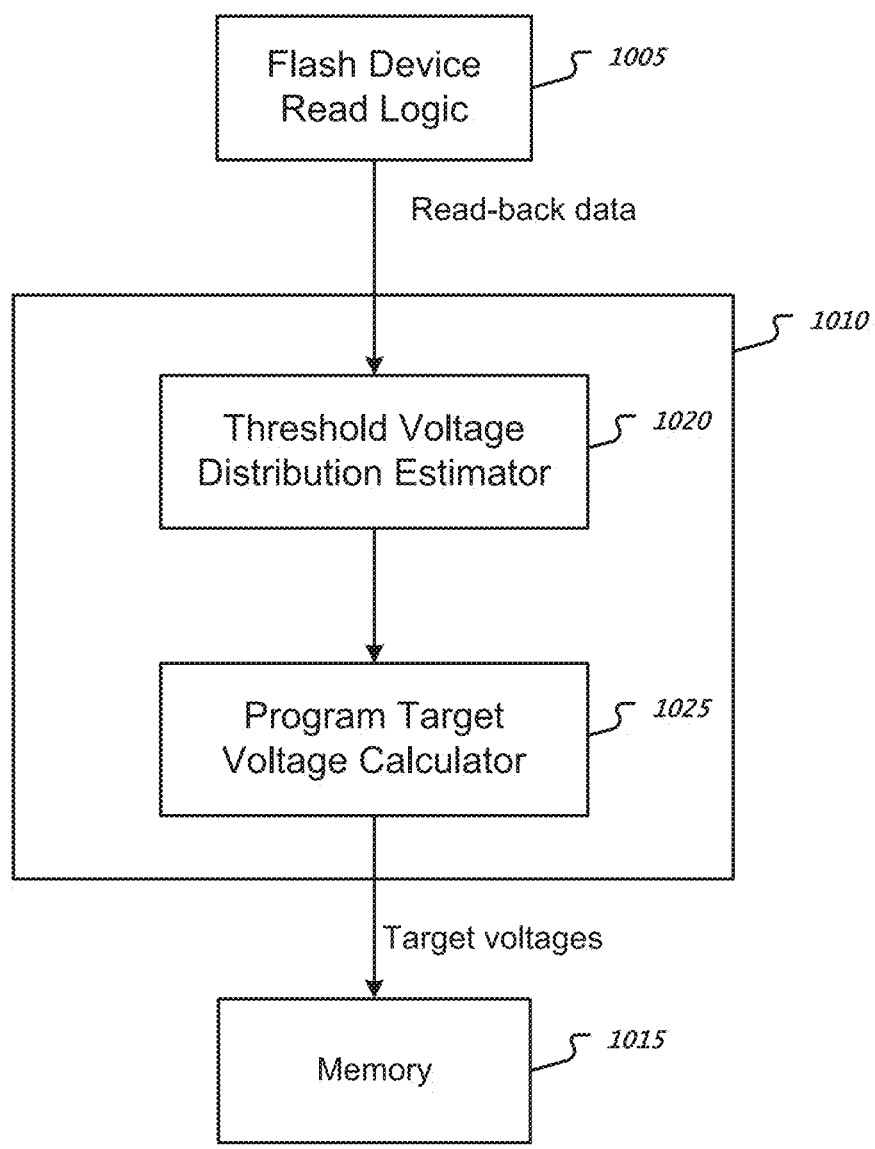

FIG. 10 shows an example of a system that dynamically adapts one or more programming voltages for uniform error distribution.

Figure 11:
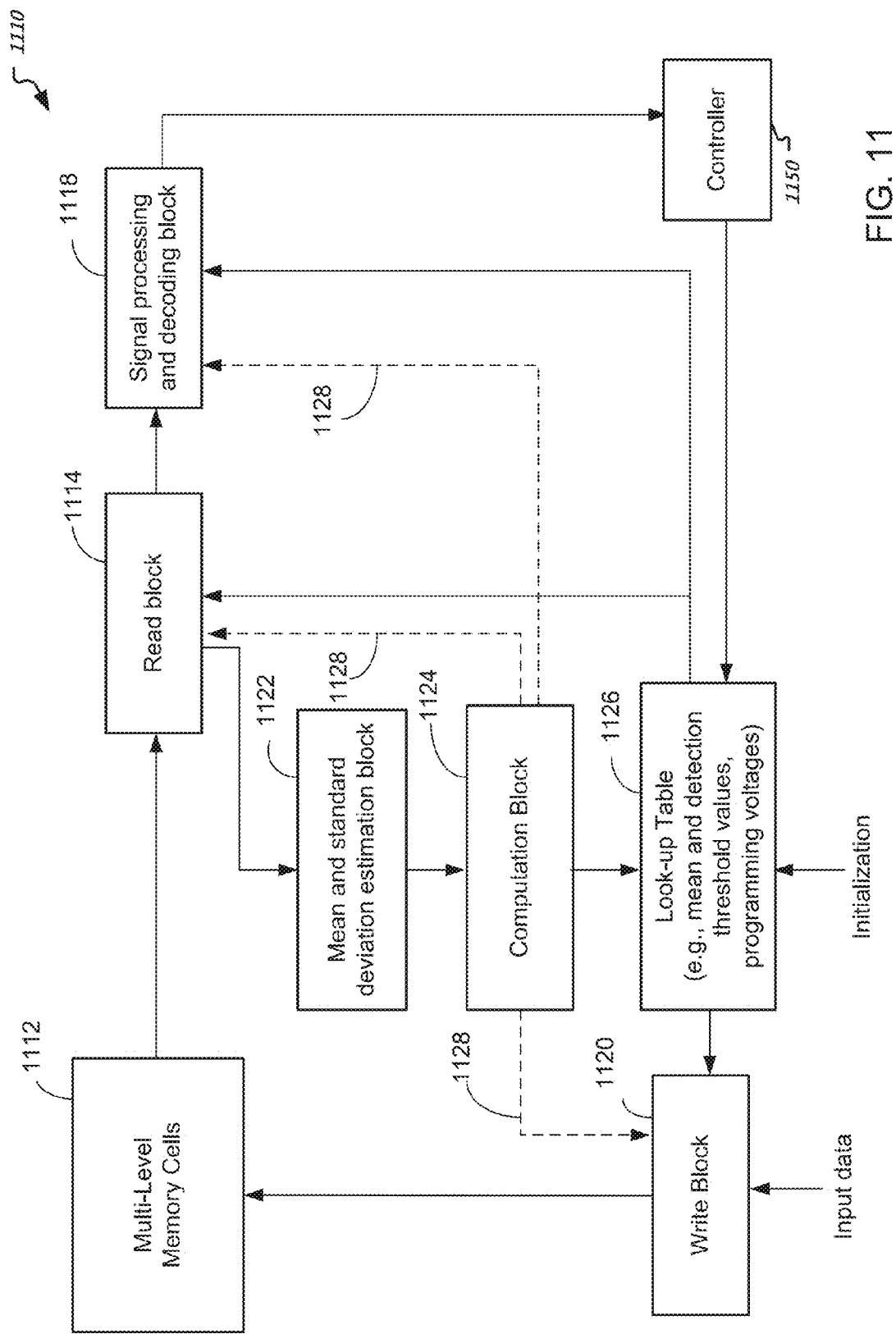

FIG. 11 shows an example of an adaptive read/write memory system that can perform one or more techniques described herein.

Figure 12:
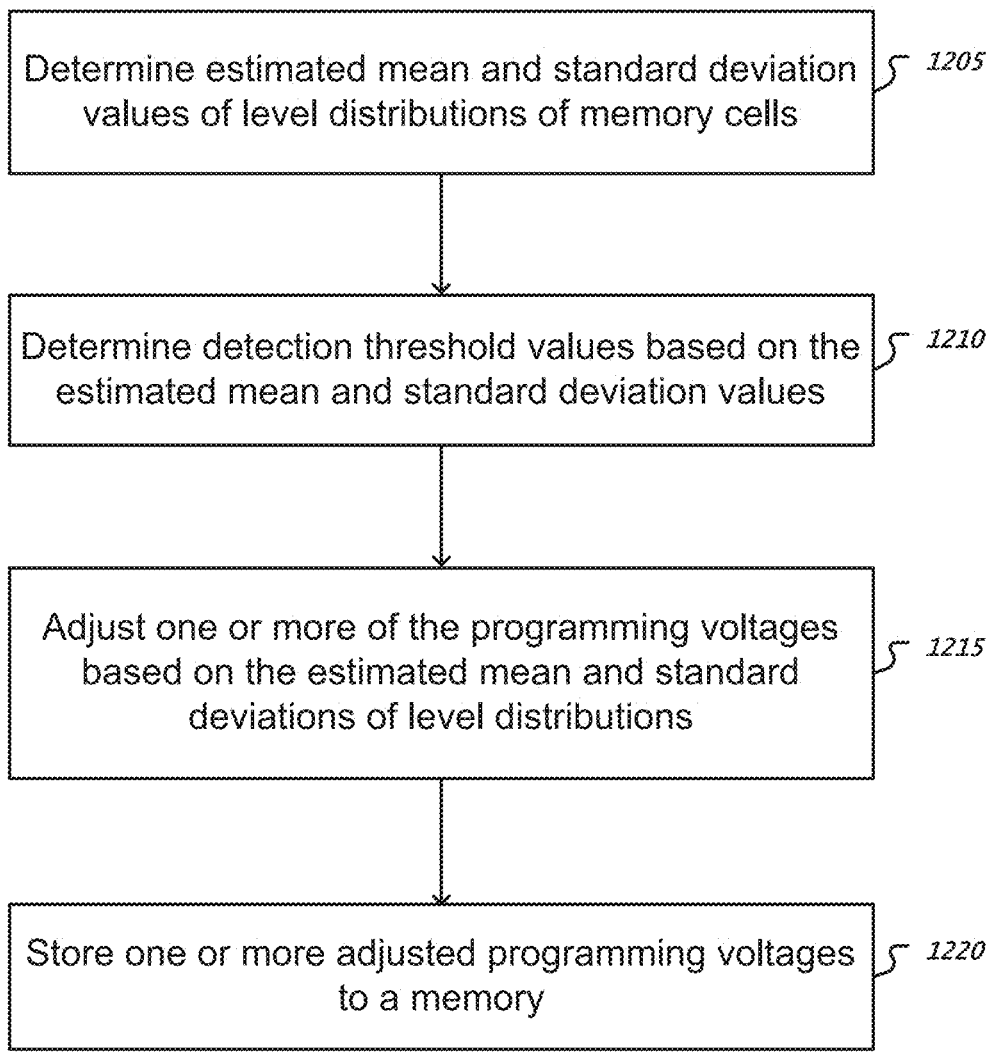

FIG. 12 shows example of a process that adjusts programming voltages.

Like reference symbols in the various drawings indicate like elements.

DETAILED DESCRIPTION

Non-volatile memory structures such as flash memory structures can store information in multi-level memory cells based on charge levels. However, it is often difficult to precisely program a multi-level memory cell with a desired amount of charge. Further, a measurement of a cell's charge level can differ from the value that was used to program the cell. For example, a cell's charge level can gradually deteriorate in the course of repeated read operations.

A memory controller can read information from multi-level memory cells. In some implementations, a memory controller uses statistical analysis to interpret a measured cell charge level. In some implementations, the actual programmed amount of charges approximately follows a Gaussian distribution centered on a desired charge level. The variance of the distribution can be determined by a programming method and one or more physical properties of the memory cell. Likewise, the threshold voltage distributions of flash memory cells can be Gaussian.

With respect to a MLC, a state can indicate two or more bit values in two or more bit positions. Left uncompensated, errors that affect a cell's charge level may have a non-uniform impact on bit values that are in different positions. One or more of the systems and techniques as described herein use cell programming voltages that are selected to reduce differences among bit error rates of individual bit positions. Based on such programming voltages, for example, errors that affect a cell's charge level may have a more uniform error distribution on bit values that are stored in different positions. A more uniform error distribution can increase the performance of a non-volatile memory device.

Memory devices can include a memory cell structure that includes multiple memory cells in an arrangement, e.g., a MLC structure. For example, some flash memory devices can include flash cells organized in an arrangement such as an X-Y array. A device can use a bit line and a word line to address an individual cell in an X-Y array.

Figure 1:
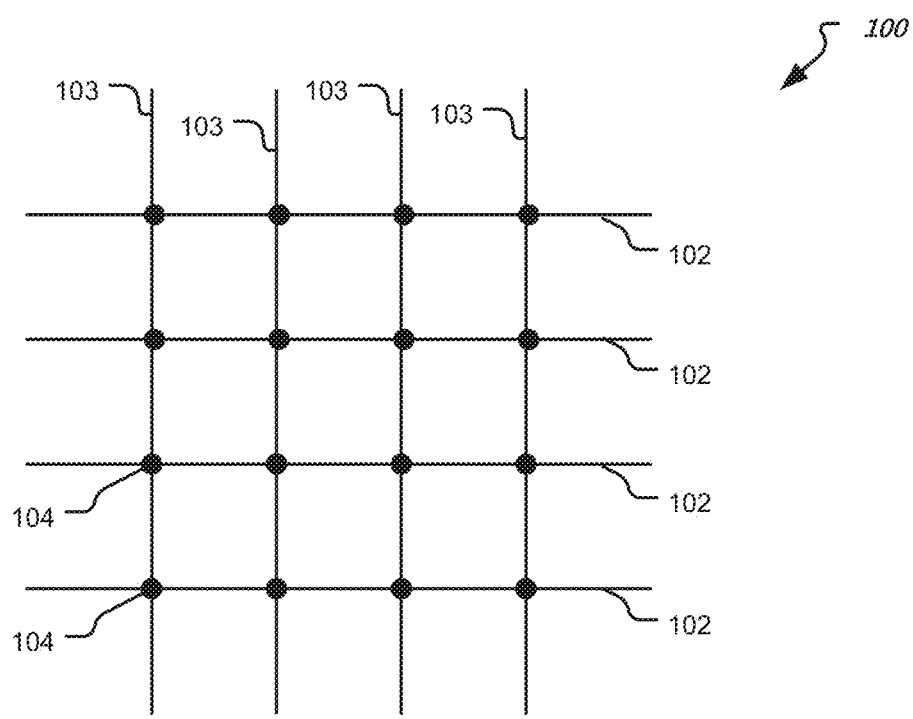
FIG. 1 shows an example of a layout of a non-volatile memory structure.

FIG. 1 shows an example of a layout of a non-volatile memory structure. A non-volatile memory structure 100 can include multiple cells 104, e.g., multi-level cells, in an X-Y array arrangement. A cell 104 can include logic configured to store information. For example, a cell 104 can store a charge (or lack thereof, e.g., a zero charge) that represents one of multiple logic states. Different logic states can be assigned to different logical values such as, in binary, logical 00, 01, 10, or 11. In some implementations, a non-volatile memory structure can include flash memory and controller logic, such as read logic and programming logic. The controller logic can use a bit line 103 and a word line 102 to address an individual cell 104.

In some implementations, an erase state is represented by logical 11. If a logical 11 value is to be stored in a flash cell such as a cell in an X-Y array, the voltage on a corresponding bit line is raised and a zero programming voltage is applied as to not cause, or at least minimize, a voltage difference; hence, the cell stays at an erase state. Otherwise, a voltage difference is setup between a corresponding word line and the corresponding bit line to program the flash cell to a non-erased state. Different voltages can be used to program different states. For example, a controller can select a voltage from a look-up table based on a state that is to be written to a cell. In some implementations, a word line can be associated with a control gate and a bit line can be associated with a drain and source.

A non-volatile memory device such as flash memory devices can organize data in a bit-page-block hierarchy. For example, for a NAND memory device, the read/program unit can be a page and the erase unit can be a block. In a SLC that can store one bit of information, a page of data resides in the cells from the same word line. In a MLC that can store more than one bit of information, the data stored in the cells from the same word line can be subdivided into two or more pages. For example, in a 2 bits-per-cell flash, the data reside in the cells from a word line are grouped into two pages. In general, for N bits-per-cell flash, the data in the same word lines are grouped into N pages. A flash device implementation can group bits associated with two or more cells that have the same significance into the same page. For example, for 2 bits-per-cell, the most significant bits (MSBs) from the cells of a word line form a first page, whereas the least significant bits (LSBs) from the same word line of cells form a second page.

Figure 2:
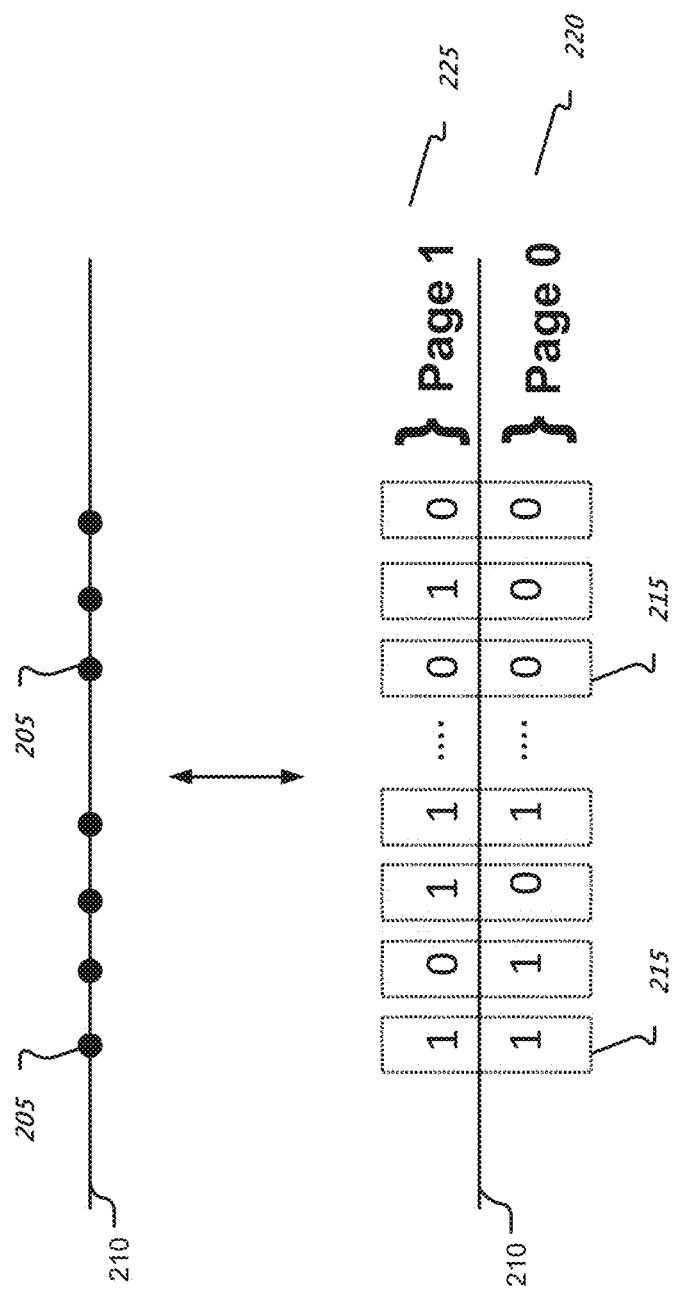
FIG. 2 shows an example of a two page layout for a multi-level cell structure.

FIG. 2 shows an example of a two page layout for a multi-level cell structure. In this example, multi-level cells 205 that are associated with the same word line 210 are grouped into two pages 225, 220. Multi-level cells 205 store information that represent states 215, respectively. A state 215 can be associated with two bits of data. A state 215 can be indicative of information that includes first bit information in a first bit position and second bit information in a second bit position. For example, a state 215 can correspond to a value for a MSB and a value for a LSB. The MSB values indicated by two or more states 215 can be grouped into a first page 225. The LSB values indicated by two or more states 215 can be grouped into a second page 220.

A non-volatile memory controller can process charge measurement data from a MLC based on threshold voltage distributions to determine a state stored by the MLC. A non-volatile memory controller can generate read data based on a determined state. In some implementations, read data include a page, such as a first page 225 or a second page 220.

Figure 3:
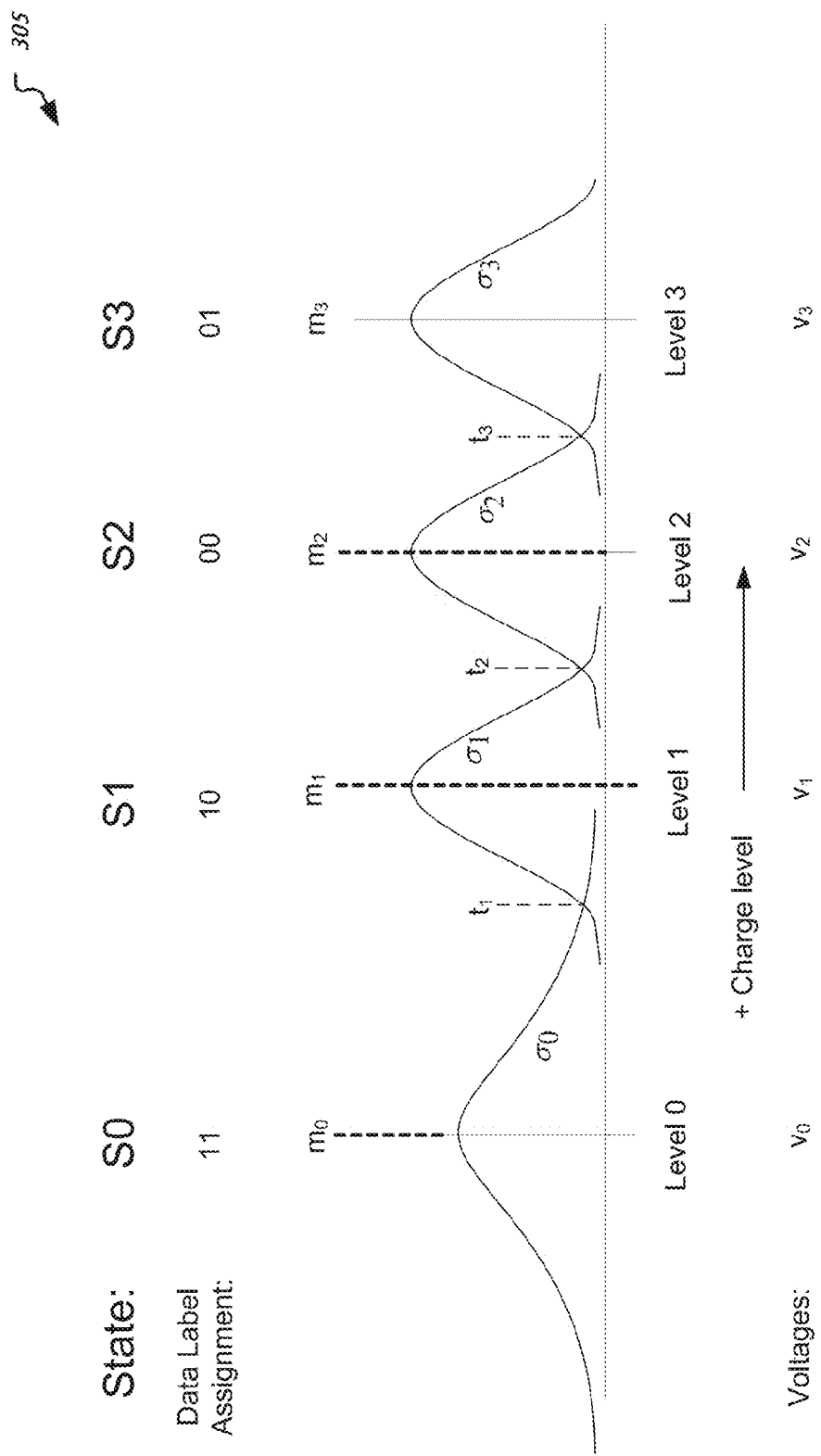
FIG. 3 shows an example of four states and associated threshold voltage distributions for a 2-bit memory cell.

FIG. 3 shows an example of four states and associated threshold voltage distributions for a 2-bit memory cell. Four states and associated threshold voltage distributions are arranged on a graph 305 depicted by FIG. 3. The threshold voltage distributions can be referred to as level distributions. The four level distributions have mean values of $m_0$, $m_1$, $m_2$, and $m_3$ and standard distributions of $\sigma_0$, $\sigma_1$, $\sigma_2$, and $\sigma_3$ respectively.

The 2-bit memory cell can store information corresponding to one of four states (e.g., S0, S1, S2, and S3). The four states depicted by FIG. 3 with respective data label assignments of 1, 10, 00, and 01. In some implementations, a 2-bit memory cell can store information corresponding to information in a first bit position and information in a second bit position. For example, a 2-bit memory cell state can represent bit information including a most significant bit (MSB) and a least significant bit (LSB). As depicted by FIG. 3, the states, and associated data label assignments, are arranged in an ordering where each state differs by a single bit position with an adjacent state. The four states are associated with four level distributions.

The four level distributions depicted are associated with four different levels of charge that may be stored in the 2-bit memory cell, each level distribution having its own mean and variance. As depicted by FIG. 3, the intersections of the four charge levels (level 0, level 1, level 2, and level 3) define three detection thresholds (t1, t2, and t3). That is, the three detection thresholds (t1, t2, and t3) are located where curves of two adjacent level distributions intersect.

Writing and reading data to and from the 2-bit memory cell can include using detection thresholds and the means of the level distributions of the 2-bit memory cell. In some implementations, the detection thresholds (e.g., t1, t2, and t3) are used to read data from the memory cells. In some implementations, the mean values (e.g., $m_0$, $m_1$, $m_2$, and $m_3$) of the level distributions are used to write data to the memory cell. In some implementations, one or more detection thresholds are used during a read operation of a 2-bit memory cell to determine whether the charge stored in the memory cell is at level 0, level 1, level 2, or level 3. In some implementations, one or more mean values of the level distributions are required during a write operation to the memory cell to accurately target an amount of charge to be programmed into the memory cell.

For example, to determine whether the charge stored in a multi-level memory cell is in level 0 during a read operation, the value of the first detection threshold (t1) can be used. Based on the value of t1, a memory controller can determine whether a charge stored (including potentially a stored zero charge) in the memory cell is less than t1 in order to determine whether the stored charge is at level 0. Similarly, to determine whether the charge stored in the memory cell is at level 1, a memory controller can determine whether the charge stored in the memory cell is between t1 and t2.

In contrast, to target the required amount of charge to program into a multi-level memory cell during a write operation, the mean values of the level distribution can be used. For example, if the controller is operated to store a level 1 amount of charge in the memory cell, the controller can use the second mean value ($m_1$) to program the memory cell. By targeting a $m_1$ amount of charge to be stored in the memory cell, an error can be minimized—noting that $m_1$ is located at the peak of a Gaussian curve.

For a memory cell with data bits 10 stored, the nominal voltage is v1, as shown in FIG. 3. However, due to disturbances and noise, a measured voltage can become closer to v0 or v2 compared to the nominal voltage of v1, which may cause a detection error. Specifically, the LSB bit may be read erroneously if a measured voltage is closer to v0 than v1; the MSB bit may be read erroneously if a measured voltage is closer to v2 than v1.

A memory system can use one or more techniques to minimize a system bit error probability. In some implementations, a memory system can use a state encoding technique that uses Gray codes where neighboring states differ by a single bit (e.g., 00, 01, 10, 11). In some implementations, a memory system can use nominal threshold values where a crossing probability of any neighboring state are equal. A crossing probability is the likelihood that, despite being programmed to represent $S_i$, a read operation on a cell returns an adjacent state, e.g., $S_{i+1}$ or $S_{i-1}$.

However, in some memory systems, minimizing an overall system probability of bit error may produce different error probabilities for different data pages. For example, for two bits per cell with a page that is organized similar to the page structure depicted by FIG. 2 and a state encoding that is similar to the one depicted by FIG. 3, LSB pages may have an error probability almost twice as that of the MSB pages. The neighboring states of S0 and S1 have identical MSBs, whereas the LSBs differ. Similarly, the neighboring states of S2 and S3 have identical MSBs, whereas the LSBs differ. In contrast, the neighboring states of S1 and S2 have identical LSBs, whereas the MSBs differ. Because more LSBs have the potential of differing during a read operation than MSBs, LSB pages may have an error probability almost twice as that of the MSB pages.

Let $P_e$ represent a probability of neighboring states crossing (e.g., probability of S0 crossing with S1). Non-neighboring states crossing is possible, however, the probability can be orders of magnitude lower than neighboring states crossing. In both S0, with probability ¼, and S1, with probability ¼, the MSB equals one, whereas the LSB equals zero or one. If in S0, since the neighboring state has MSB equal to one, crossing from S0 to S1 does not produced an error for the MSB. However, when crossing from S1 to S2, the MSB bit is in error. Therefore, the MSB error probability can be computed as $$P_{msb} = \frac{1}{4} \cdot P_e + \frac{1}{4} \cdot P_e = P_e/2.$$

On the other hand, the LSB error probability is computed as $$P_{lsb} = \frac{1}{4} \cdot P_e + \frac{1}{4} \cdot P_e + \frac{1}{4} \cdot P_e + \frac{1}{4} \cdot P_e = P_e.$$

Consequently, $P_{lsb} = 2 \cdot P_{msb}$.

A non-uniform error distribution, e.g., $P_{lsb} \neq P_{msb}$, can cause inefficiencies in a flash storage system design, in particular, in terms of data reliability. From the user perspective, a page, whether being a LSB or MSB page, is treated the same in the sense that it contains desired data. This is also often true from a design perspective, where the error correction codes applied are often identical across all the data pages in a device for ease of design. The weakest pages (e.g., LSB pages in the previous example) may become a bottleneck and predominant factor of data reliability and device life cycle. For the 2 bits-per-cell example, the device reliability is determined by $P_{lsb}$, rather than $P_{msb}$, as that is a predominant factor in determining the data reliability and device life.

Creating a more uniform page error distribution can alleviate a performance bottleneck caused by one or more types of pages, e.g., LSB pages. For example, a memory system can be constructed such that different types of data pages, e.g., MSB data page, LSB data page, experience the same probability of error. In some implementations, a memory system selects nominal threshold voltages that are associated with respective states to reduce differences among error distributions of different types of pages.

Figure 4:
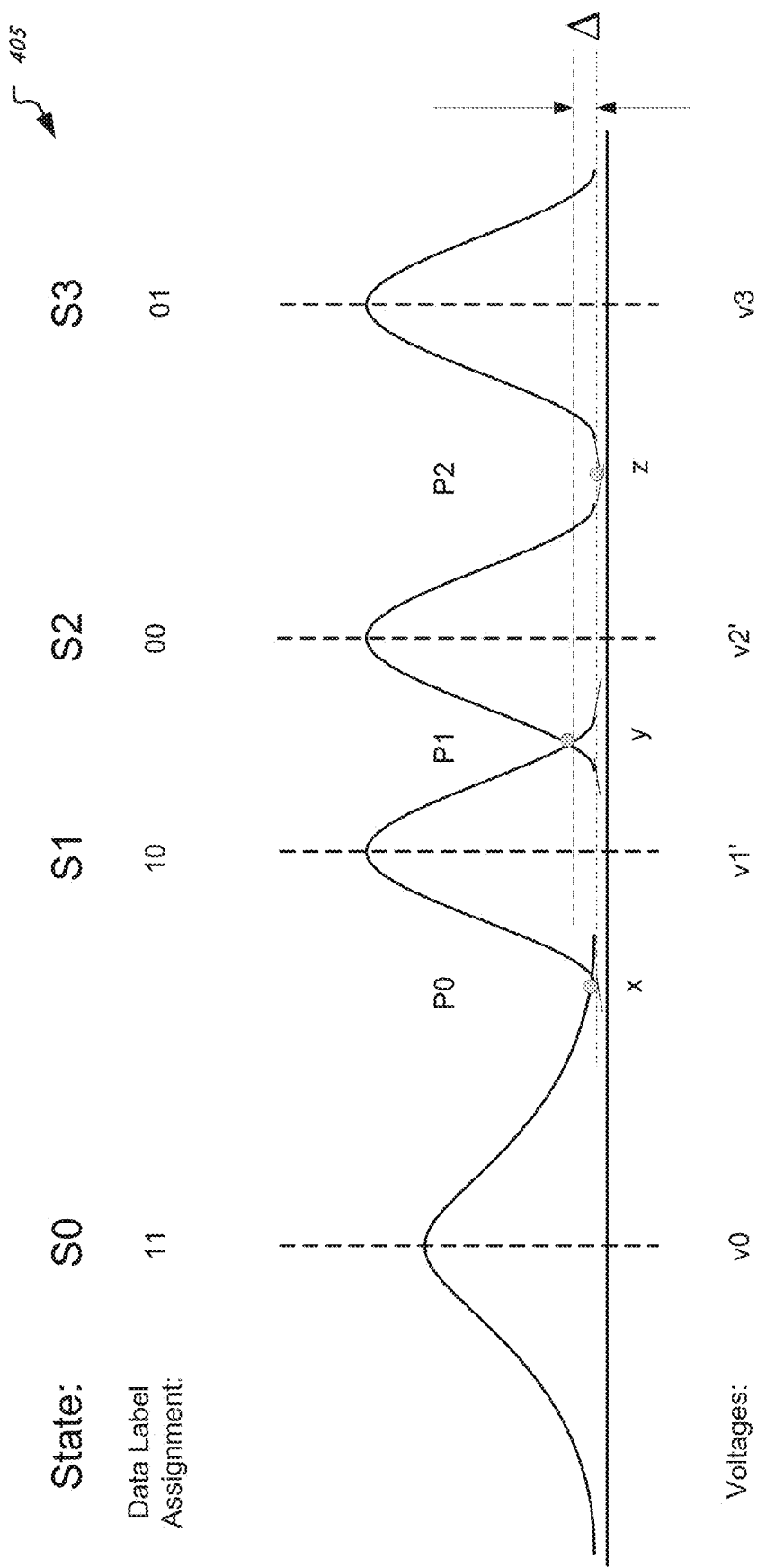
FIG. 4 shows an example of a distribution of threshold voltages that reduces differences among error distributions of different types of pages.

FIG. 4 shows an example of a distribution of threshold voltages that reduces differences among error distributions of different types of pages. In this example, a memory system can include a data structure that stores nominal threshold voltage values such as programming voltages (e.g., v0, v1', v2', and v3) that are associated with different memory cell states (e.g., S0, S1, S2, and S3), respectively, of a 2-bit memory cell. In some implementations, a memory system can include a controller configured to determine one or more programming voltages. In some implementations, one or more programming voltages are fixed such as a minimum programming voltage and a programming maximum voltage.

Four states (e.g., S0, S1, S2, and S3) and associated threshold voltage distributions, e.g., density distribution functions, are arranged on a graph 405 depicted by FIG. 4. The graph 405 shows multiple cross-overs of different threshold voltage distributions. As shown in the graph 405, the density distribution functions associated with the states cross over at different points (points labeled x, y, and z). Points x and z differ from point y by $\Delta$, where $\Delta > 0$. This is in contrast to some designs where all of the distribution functions cross over at the same value. The graph 405 depicts three crossing-over probabilities labeled $P_0$, $P_1$, and $P_2$ that are associated with these points, respectively.

Let $P_0$ represent the crossing-over probability from S0 to S1. A crossing-over probability can be symmetric, e.g., the probability that S1 crosses over S0 equals the probability that S0 crosses over S1. In some implementations, the probability of MSB bit error is calculated based on $$P_{msb} = \frac{1}{4} \cdot P_1 + \frac{1}{4} \cdot P_1 = P_1/2.$$

Whereas, the probability of LSB bit error is calculated based on $$P_{lsb} = \frac{1}{4} \cdot P_0 + \frac{1}{4} \cdot P_0 + \frac{1}{4} \cdot P_2 + \frac{1}{4} \cdot P_2 = \frac{1}{2} \cdot P_0 + \frac{1}{2} \cdot P_2.$$

For $P_{msb} = P_{lsb}$, it holds that $P_1 = P_0 + P_2$. If $P_0 = P_2$, then $P_1 = 2 \cdot P_2$. In other words, the probability of neighboring states crossing probability can be adjusted such that the MSBs and LSBs have the same, or nearly the same, probability of error. A memory system can use nominal threshold voltage values that are unevenly distributed across the entire permissible range, e.g., a range from v0 to v3.

In some implementations, the Vt distributions are Gaussian with variances $\sigma_0^2$, $\sigma_1^2$, $\sigma_2^2$, and $\sigma_3^2$, respectively. In some implementations, values v0 and v3 are predetermined. The mean values v1' and v2' can be found based on solving the following set of equations:

$$\frac{1}{\sqrt{2\pi}\,\sigma_0}e^{-\frac{(x-v0)^2}{2\sigma_0^2}} = \quad (EQ\ 1)$$

$$\frac{1}{\sqrt{2\pi}\,\sigma_1}e^{-\frac{(x-v1')^2}{2\sigma_1^2}} = \frac{1}{\sqrt{2\pi}\,\sigma_2}e^{-\frac{(z-v2')^2}{2\sigma_2^2}} = \frac{1}{\sqrt{2\pi}\,\sigma_3}e^{-\frac{(z-v3)^2}{2\sigma_{31}^2}},$$

$$\frac{1}{\sqrt{2\pi}\,\sigma 1}e^{-\frac{(y-v1')^2}{2\sigma_1^2}} = \frac{1}{\sqrt{2\pi}\,\sigma_2}e^{-\frac{(y-v2')^2}{2\sigma_{21}^2}}, \quad (EQ\ 2)$$

and $$\frac{1}{4}Q\left(\frac{x-v0}{\sigma_0}\right) + \frac{1}{4}Q\left(\frac{x-v1'}{\sigma_{1'}}\right) + \frac{1}{4}Q\left(\frac{z-v2'}{\sigma_2}\right) + \frac{1}{4}Q\left(\frac{z-v3}{\sigma_3}\right) = \quad (EQ3)$$

$$\frac{1}{4}Q\left(\frac{y-v1'}{\sigma_1}\right) + \frac{1}{4}Q\left(\frac{y-v2'}{\sigma_2}\right).$$

The techniques and systems described above can be applied to n-bit memory cells, where n>2. In some implementations, a n-bit memory cell is a n-bit flash memory cell.

Figure 5:
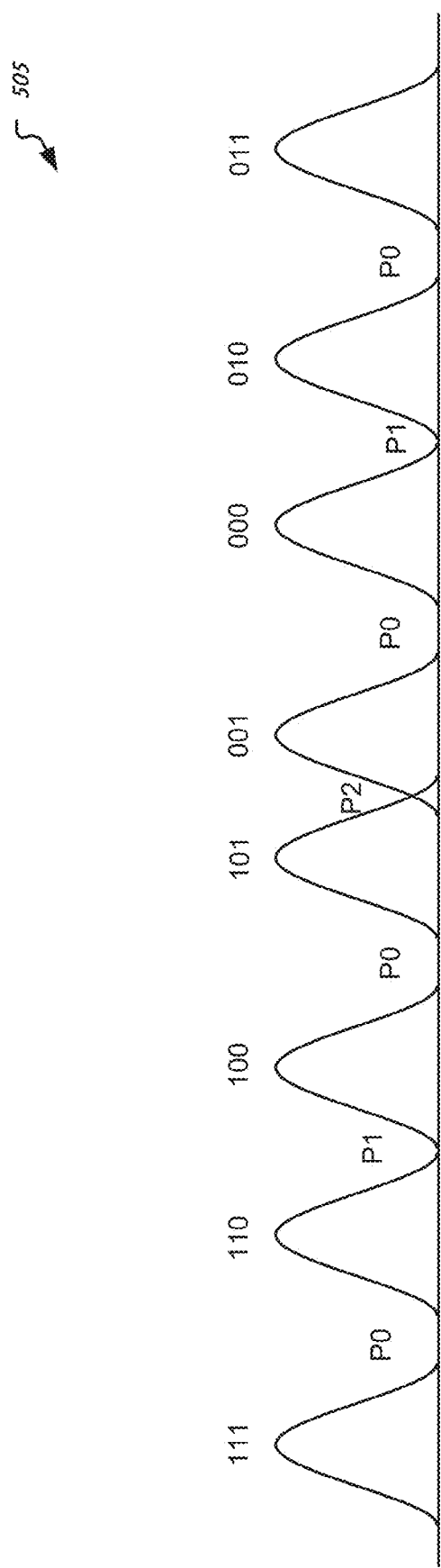
FIG. 5 shows another example of a distribution of threshold voltages that reduces differences among error distributions of different types of pages.

FIG. 5 shows another example of a distribution of threshold voltages that reduces differences among error distributions of different types of pages. A memory system can include 3-bit memory cells. A 3-bit memory cell can store one of eight different states (e.g., S0 to S7). As depicted by FIG. 5, the graph 505 shows three crossing-over probabilities labeled $P_0$, $P_1$, and $P_2$ that are associated with crossing-over probabilities of neighboring states. In this example, the states are encoded based on Gray encoding. The nominal threshold voltages can have the same variance. Under such conditions, the nominal threshold voltage values can be assigned such that the crossing probabilities satisfy $P_2=2\cdot P_1=4P_0$.

In some implementations, a MLC flash memory device stores data in physical pages that behave statistically similar or identical in terms of bit error rate, regardless of a bit significance of a page, e.g., MSB page or LSB page. Techniques for MLC flash memory devices can include assigning nominal threshold voltage distributions for each state in a MLC flash memory device such that at least two of the crossing-over probability of neighboring states are different and the resulting bit error rates for bits of different significance (e.g., MSB, LSB) in a flash cell are statistically similar or identical.

Figure 6:
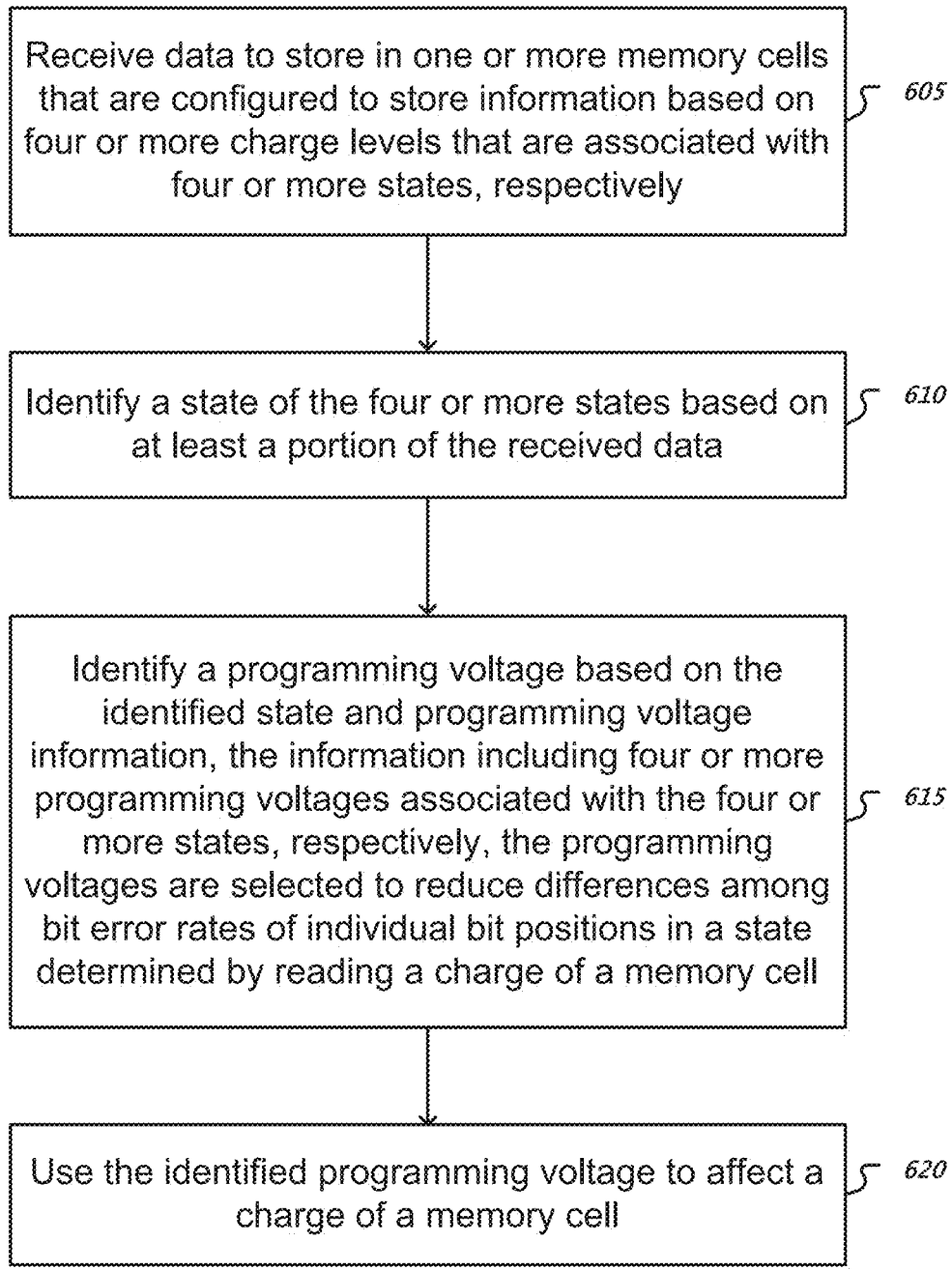
FIG. 6 shows an example of a non-volatile memory controller process.

FIG. 6 shows an example of a non-volatile memory controller process. At 605, a controller receives data to store in one or more memory cells that are configured to store information based on four or more charge levels. The four or more charge levels can be associated with four or more states respectively. In some implementations, the states are arranged in an ordering where each state differs by a single bit position with an adjacent state. In some implementations, each state is indicative of information that includes first bit information in a first bit position and second bit information in a second bit position. For example, a state can be indicative of information associated with a MSB and information associated with a LSB.

At 610, the controller identifies a state of the four or more states based on at least a portion of the received data. At 615, the controller identifies a programming voltage based on the identified state and programming voltage information. Programming voltage information can include four or more programming voltages associated with the four or more states, respectively. The programming voltages can include a programming voltage that is zero. In some implementations, programming voltages can include one or more programming voltages that are below zero. In some implementations, the programming voltages are selected to reduce differences among bit error rates of individual bit positions in a state determined by reading a charge of a memory cell. Programming voltages can be selected such that two or more crossing-over probabilities of neighboring states are different. In some implementations, a controller can calculate programming voltages based on solving EQ1, EQ2, and EQ3 to find values for v1' and v2' based on known values including variances, v0, v3, and Q. In some implementations, a controller can store determined programming voltages in a memory structure such as a look-up table.

At 620, the controller uses the identified programming voltage to affect a charge of a memory cell. Affecting a charge of a memory cell can include using a programming voltage to increase a charge level of the cell. In some cases, affecting a charge of a memory cell can include using a programming voltage that is zero to maintain an erase state of a cell, e.g., adding zero charge to the cell. In some cases, affecting a charge of a memory cell can include using a programming voltage that is negative.

FIG. 7 shows an example of a system with non-volatile memory that can perform one or more techniques described herein. A system can include a data processing device with embedded or removable non-volatile memory. A data processing device such as a digital media player, digital camera, personal data assistant (PDA), mobile phone, computer, or embedded device can include one or more of: non-volatile storage device 715 that can include one or more flash memory structures, processing device 705, and input/output (I/O) 720 channel(s) and connection(s) such as video/audio/image input, text input, positioning input, or video/audio/image output. In some implementations, a processing device 705 can include one or more processors or specialized processing logic. In some implementations, a processing device 705 can include a memory that stores instructions to operate a processor to interact with a non-volatile storage device 715.

Processing device 705 can read from and/or write to the non-volatile storage device 715. For example, data received from I/O 720 can be stored on the non-volatile storage device 715. In another example, content from a file retrieved from the non-volatile storage device 715 can be digitally reproduced as output on I/O 720. In some implementations, a removable unit can contain the non-volatile memory device 715.

In some implementations, a processing device 705 can access a non-volatile storage device 715 based on a data segment such as a data sector(s). A data sector can include a fixed amount of data, e.g., a fixed number of bytes. In some implementations, a processing device 705 can write data such as a logical data sector to a non-volatile storage device 715, and in turn, a non-volatile storage device 715 can write data to a physical data sector, e.g., a grouping of memory cells.

A non-volatile storage device 715 can include processor electronics. In some implementations, a non-volatile storage device 715 includes a controller that is communicatively coupled with one or more flash memory structures. A non-volatile storage device 715 can obtain data from a host such a processing device 705 and can store the data to one or more data segments in a non-volatile memory structure (not shown). A non-volatile storage device 715 can read data from one or more data segments in a non-volatile memory structure and can send data to a device such as a processing device 705. In some implementations, a non-volatile storage device 715 encodes data before storing data in a non-volatile memory structure. Encoding data can include using an error correcting code (ECC). In some implementations, encoding data includes using an error detection checksum. Various examples of non-volatile storage device 715 embodiments include implementations on a single integrated circuit die, on multiple dies within a single chip package, and on multiple dies in respective chips in a device package. In some implementations, a non-volatile storage device 715 includes a flash controller and a flash device, e.g., a flash memory integrated circuit. A flash memory integrated circuit can be referred to as a flash chip.

A non-volatile storage device can use one or more techniques for providing uniform error distributions among pages for MLCs that are static, dynamic, or both. In a static technique, programming target voltages are set during device manufacturing as read-only values. In a dynamic technique, programming target voltages are calculated based on the current device conditions. In some implementations, programming target voltages are set during device manufacturing as read-write values. A controller, for example, can update the programming target voltages to adapt to one or more changes in the device's operation.

FIG. 8 shows another example of a system with non-volatile memory that can perform one or more techniques described herein. A host 805 can access a flash device 820 via a flash controller 815. A host 805 can include a processing system. The flash controller 815 can determine programming target voltages that provide uniform error distributions among pages. Determining programming target voltages can include calculating updates to the programming target voltages. The flash controller 815 can send one or more programming target voltages to the flash device 820 via a controller-device interface. The flash device 820 can perform programming operations based on one or more target voltages provided by the flash controller 815.

The flash controller 815 can include a $V_t$ target voltage calculation module 830. The $V_t$ target voltage calculation module 830 can include circuitry to monitor data produced by the flash device 820. In some implementations, a $V_t$ target voltage calculation module 830 can use a bit error rate associated with data produced by the flash device 820 to update one or more target voltages. In some implementations, flash controller 815 implements functionality of the $V_t$ target voltage calculation module 830 in the controller's firmware.

The flash device 820 can include read logic 835, programming logic 850, flash memory 845, and a target voltage memory 840. The read logic 835 can measure a charge level of one or more cells in a flash memory 845. The read logic 835 can access one or more target voltage values, e.g., one or more values of $V_t$, from the target voltage memory 840 to interpret charge measurement data. In some implementations, read logic 835 can interpret charge measurement data based on one or more detection threshold values that are associated with respective target voltage values. The programming logic 850 can obtain a target voltage value from the target voltage memory 840. The programming logic 850 can write to a cell in a flash memory 845 based on the obtained target voltage value. For example, a programming logic 850 can access a memory location in the target voltage memory 840 that corresponds to a state that the programming logic 850 is required to program into a cell of the flash memory 845.

FIG. 9 shows yet another example of a system with non-volatile memory that can perform one or more techniques described herein. A host 905 can access a flash device 920 via a flash controller 915. A flash device 920 can determine one or more programming target voltages that provide uniform error distributions among pages. Determining such voltages can be transparent to the flash controller 915 and to the host 905. In some implementations, the flash device 920 performs programming operations based on one or more target voltages when the flash controller 915 issues a programming command.

The flash device 920 can include a $V_t$ target voltage calculation module 930, read logic 935, programming logic 950, flash memory 945, and a target voltage memory 940. The $V_t$ target voltage calculation module 930 can include circuitry to monitor data produced by the flash device 920. In some implementations, a $V_t$ target voltage calculation module 930 can use an error rate determined by the read logic 935 to update one or more programming target voltages in a target voltage memory 940.

The read logic 935 can measure a charge level of one or more cells in a flash memory 945. The read logic 935 can access one or more target voltages from the target voltage memory 940 to interpret charge measurement data. The read logic 925 can provide bit error rate information to a $V_t$ target voltage calculation module 930.

The programming logic 950 can obtain a target voltage from the target voltage memory 940. The programming logic 950 can write to a cell in a flash memory 945 based on the obtained target voltage. For example, a programming logic 950 can access a memory location in the target voltage memory 940 that corresponds to a state that the programming logic 950 is required to program into a cell of the flash memory 945. Data in the accessed memory location can include a voltage value.

FIG. 10 shows an example of a system that dynamically adapts one or more programming voltages for uniform error distribution. Dynamically adapting one or more programming voltages for uniform error distribution can include using an estimation block and a calculation block. An estimation block can provide estimates of variances for each Vt distribution at a given programming voltage target range. Variance estimation can be based on read-back information from a flash device read logic 1005. A calculation block calculates one or more desired Vt target voltages such that uniform error distributions among pages are achieved. In FIG. 10, a target voltage module 1010 includes a threshold voltage distribution estimator 1020 and a program target voltage calculator 1025.

The threshold voltage distribution estimator 1020 can receive read-back data from a flash device read logic 1005. In some implementations, an estimator 1020 receives error data associated with data produced by a read operation. The estimator 1020 can determine estimates of variances for one or more Vt distributions at one or more programming voltage target ranges.

The program target voltage calculator 1025 can calculate one or more Vt target voltages that achieve uniform error distributions among pages. The calculator 1025 can write one or more calculated target voltages to a memory 1015. In some implementations, the target voltage module 1010 includes the memory 1015. In some implementations, a non-volatile memory structure includes a space reserved for target voltages.

In some implementations, a data processing system can include a host system and one or more adaptive read and write memory systems that can adapt to changes to level distributions of multi-level memory cells. In some implementations, adaptive read and write memory systems and methods can compute new mean values of level distributions, new detection threshold values of multi-level memory cells, or both after the memory cells have degraded as a result of, for example, repeated cycling. Such computed new mean and detection threshold values can be referred to as "optimal or near optimal" values. That is, the phrase "optimal or near optimal" is used in reference to the new mean and detection threshold values that can be computed based on an optimal solution, which may be a more complex solution requiring more computational power, or a simpler near optimal (e.g., approximate) solution. Such values can be calculated based on data collected from a multi-level cell read operation.

Adaptive memory read and write techniques can adjust to level distributions changes of memory cells and to reduce differences among bit error rates of individual bit positions in a state determined by reading a charge of the memory cell. Adaptive memory read and write systems can include multi-level memory cells, e.g., multi-level flash memory cells, and a computation block operatively coupled to the multi-level memory cells. The computation block can be configured to compute optimal or near optimal mean and detection threshold values based, at least in part, on estimated mean and standard deviation values of level distributions of the multi-level memory cells. The optimal or near optimal mean and detection threshold values computed by the computation block can be subsequently used to facilitate writing and reading, respectively, of data to and from the multi-level memory cells. The computation block can determine programming voltages such that at least two of the crossing-over probability of neighboring states are not the same and that bit error rates for bits of different significance in a multi-level cell are statistically similar or identical.

In an adaptive memory read and write system, a computation block can be operatively coupled to multi-level memory cells via an estimation block. An estimation block can determine the estimated mean and standard deviation values used by the computation block to compute the optimal or near optimal mean and detection threshold values. In some implementations, multi-level memory cells can include one or more pilot cells to store predetermined data. An estimation block can be configured to determine the estimated mean and standard deviation values using one or more pilot cells. The system can include a look-up table that is operatively coupled to the computation block. In some implementations, a look-up table can be configured to store the estimated mean and standard deviation values determined by the estimation block. In some implementations, a look-up table can be configured to store the optimal or near optimal mean and detection threshold values computed by the computation block.

FIG. 11 shows an example of an adaptive read/write memory system that can perform one or more techniques described herein. A read/write memory system 1110, as in conventional read/write memory systems, can include multi-level memory cells 1112, a read block 1114, a signal processing and decoding block 1118, and write block 1120. However, unlike conventional systems, the system 1110 can further include a mean and standard deviation estimation block 1122, a computation block 1124, and a look-up table 1126, operationally coupled together. One or more of the components depicted, such as the mean and standard deviation estimation block 1122 and the computation block 1124, can be implemented using hardware components, such as, for example, application specific integrated circuit (ASIC), firmware, or both. In some implementations, write target values and corresponding optimal read values are computed based on estimated mean and deviation values for various cell states.

The mean and standard deviation estimation block 1122 can be configured to calculate estimated mean and standard deviation values of level distributions of the memory cells 1112 during, for example, a read operation of the memory cells 1112. The computation block 1124 can be configured to compute optimal or near optimal mean and detection threshold values based on the estimated mean and standard deviation values provided by the estimation block 1122. Computed optimal or near optimal mean values can be used to adaptively write data into the memory cells 1112. Computed detection threshold values can be used to adaptively read data stored in the memory cells 1112. To even out the error distributions among bits of different significance, the read/write memory system 1110 can compute one or more targeted programming voltage values based on solving equations such as EQ1, EQ2, and EQ3. The read/write memory system 1110 can compute corresponding detection threshold values associated with the computed target programming voltage values. The read/write memory system 1110 can use at least one of these computed target programming voltages for programming a cell with a state.

The optimal or near optimal mean and detection threshold values computed by the computation block 1124 and the estimated mean and standard deviation values calculated by the estimation block 1122 can be stored in the look-up table 1126. The read block 1114, the signal processing and decoding block 1118, and the write block 1120 can use selected values stored in and provided by the look-up table 1126 to perform various operations. The signal processing and decoding block 1118 can provide read-back data to a controller 1150 which can provide read-back data to circuitry such as a host interface. Alternatively, such values can be directly provided by the estimation block 1122 and the computation block 1124 as indicated by reference 1128.

The estimation block 1122 can calculate estimated mean and standard deviation values of level distributions of the memory cells 1112 during a read operation. The estimated mean and standard deviation values can be calculated and provided to the computation block 1124. The computation block 1124 can compute the optimal or near optimal mean and detection threshold values based, at least in part, on the estimated mean and standard deviation values. Estimated mean and standard deviation values can be calculated for each level distribution of a memory cell.

In some implementations, the estimation of the mean and standard deviation values can be achieved via training or online adaptation. For example, the estimated mean and standard deviation values can be calculated by using pilot memory cells having known or predetermined data. That is, certain memory cells 1112 can be designated as pilot memory cells, where the data stored in these memory cells are predefined and known. The read block 1114 can then exploit these pilot cells for estimating the mean and standard deviations. A training technique can include estimating the mean and standard deviations of level distributions of a memory cell. Alternatively, online adaptation techniques can be employed for estimating the mean and standard deviations. For instance, a least-mean-squares (LMS) algorithm can be used to estimate the mean and standard deviations based on the data recovered from the memory cells.

Based on the estimated mean and standard deviation values calculated by the estimation block 1122, the computation block 1124 can compute optimal or near optimal mean and detection threshold values for a memory cell or a group of memory cells. One example is given by EQ1, EQ2, and EQ3 which can be solved based on a set of maximum and minimum threshold voltages and the estimated variances for each state. The calculated optimal or near optimal mean and detection threshold values can then be stored in a look-up table 1126.

A look-up table 1126 can include store entries indexed by a block index, e.g., a reference to a block of memory cells. An entry in a look-up table 1126 can include one or more estimated mean values, one or more estimated standard deviations, one or more near optimal or optimal means values, and one or more near optimal or optimal detection thresholds. The computation block 1124 can compute information such as near optimal or optimal means values, and near optimal or optimal detection thresholds. In some implementations, a block or a group of memory cells can be associated with common estimated mean and standard deviation values, as well as common optimal or near optimal mean and detection threshold values.

A multi-level memory cell can have multiple charge levels which are associated respective states. Therefore, an entry in the look-up table 1126 can include respective multiple estimated mean values, multiple estimated standard deviations, multiple near optimal or optimal means values, and multiple near optimal or optimal detection thresholds.

In some implementations, the computation block 1124 can compute the optimal or near optimal mean and detection threshold values as soon as the estimated mean and standard deviations are calculated by the estimation block 1122. In some implementations, the optimal or near optimal mean and detection threshold values can be computed at some later time after the estimated mean values and estimated standard deviation values have already been stored in the table 1126.

A look-up table 1126 can include programming voltages that, when used, will yield different crossing-over probabilities between adjacent states. A controller 1150 can use readback data to adjust one or more programming voltages in the look-up table 1126.

FIG. 12 shows example of a process that adjusts programming voltages. At 1205, a controller determines estimated mean and standard deviation values of level distributions of memory cells. Determining such values can include using information collected during read-back of one or more flash memory cells. At 1210, the controller determines detection threshold values based on the estimated mean and standard deviation values, which can be used to read the current programmed data. At 1215, the controller adjusts one or more of the programming voltages based on the estimated mean and standard deviations of level distributions of one or more memory cells. The programming target voltages can be computed such that the bits associated with different significances have uniform error probabilities. The adjusted programming voltages can be used when a cell is programmed. In some implementations, an updated set of detection thresholds are computed for use when the cells are refreshed or reprogrammed using the adjusted set of programming voltages. In some implementations, a controller can monitor bit error rates of individual bit positions. In some implementations, a controller can adjust programming voltages based on changes in bit error rates of individual bit positions. At 1220, the controller stores one or more adjusted programming voltages to a memory. In some implementations, a controller determines when to make adjustments to the programming voltages based on a predetermined number of device reads, writes, or a combination thereof.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:
1. An apparatus, comprising:
circuitry configured to monitor read-back data from a group of memory cells that are programmable based on a group of programming voltages, each of the memory cells being configured to represent two or more bits by a charge level, the two or more bits corresponding to two or more bit positions;

circuitry configured to determine estimated mean and standard deviation values of level distributions of the memory cells based on the read-back data; and circuitry configured to adjust one or more of the programming voltages based on the estimated mean and standard deviations of the level distribution such that differences among bit error rates of the bit positions are reduced.

2. The apparatus of claim 1, wherein the bit positions include a first bit position and a second bit position, wherein the first bit position is associated with a first physical page, wherein the second bit position is associated with a second physical page.

3. The apparatus of claim 2, wherein the circuitry configured to adjust comprises circuitry configured to adjust the programming voltages to reduce differences among bit error rates of the physical pages.

4. The apparatus of claim 1, wherein the circuitry configured to adjust comprises circuitry configured to select the programming voltages such that two or more crossing-over probabilities of neighboring states of the two or more bits are different.

5. The apparatus of claim 1, comprising:
circuitry configured to determine detection threshold values based on the estimated mean and standard deviation values; and
circuitry configured to use the detection threshold values for interpreting values associated with read-back data from the memory cells.

6. The apparatus of claim 1, wherein the one or more of the programming voltages are adjusted in response to a change in bit error rates of individual bit positions.

7. The apparatus of claim 1, wherein the one or more of the programming voltages are adjusted in response to a predetermined number of writes, reads, or both.

8. The apparatus of claim 1, comprising:
a memory configured to store the programming voltages, and any adjustments thereto.

9. The apparatus of claim 1, wherein the memory cells include flash memory cells.

10. A system comprising:
a non-volatile memory structure comprising a group of memory cells that are programmable based on a group of programming voltages, each of the memory cells being configured to represent two or more bits by a charge level, the two or more bits corresponding to two or more bit positions; and
circuitry configured to monitor read-back data from the non-volatile memory structure, determine estimated mean and standard deviation values of level distributions of the memory cells based on the read-back data, and adjust one or more of the programming voltages based on the estimated mean and standard deviations of the level distribution such that differences among bit error rates of the bit positions are reduced.

11. The system of claim 10, wherein the bit positions include a first bit position and a second bit position, wherein the first bit position is associated with a first physical page, wherein the second bit position is associated with a second physical page.

12. The system of claim 11, wherein the circuitry configured to adjust comprises circuitry configured to adjust the programming voltages to reduce differences among bit error rates of the physical pages.

13. The system of claim 10, wherein the circuitry configured to adjust comprises circuitry configured to adjust the programming voltages such that two or more crossing-over probabilities of neighboring states of the two or more bits are different.

14. The system of claim 10, wherein the circuitry comprises:
circuitry configured to determine detection threshold values based on the estimated mean and standard deviation values; and
circuitry configured to use the detection threshold values for interpreting values associated with read-back data from the memory cells.

15. The system of claim 10, wherein the one or more of the programming voltages are adjusted in response to a change in bit error rates of individual bit positions.

16. The system of claim 10, wherein the one or more of the programming voltages are adjusted in response to a predetermined number of writes, reads, or both.

17. The system of claim 10, comprising:
a memory configured to store the programming voltages, and any adjustments thereto.

18. The system of claim 10, wherein the memory cells include flash memory cells.

19. A method comprising:
determining one or more voltage level distributions associated with a group of memory cells, each of the memory cells being configured to represent two or more bits by a charge level, the two or more bits corresponding to two or more bit positions, the group of memory cells being programmed based on a group of programming voltages; and
adjusting one or more of the programming voltages based on the one or more voltage level distributions such that differences among bit error rates of the bit positions are reduced.

20. The method of claim 19, wherein the bit positions include a first bit position and a second bit position, wherein the first bit position is associated with a first physical page, wherein the second bit position is associated with a second physical page.

21. The method of claim 20, wherein adjusting the one or more of the programming voltages comprises adjusting the one or more of the programming voltages to reduce differences among bit error rates of the physical pages.

22. The method of claim 19, wherein adjusting the one or more of the programming voltages comprises adjusting the one or more of the programming voltages such that at least two or more crossing-over probabilities of neighboring states, which are associated with two or more bits of a memory cell, are different.

23. The method of claim 19, comprising:
determining when to adjust the one or more of the programming voltages based on a change in bit error rates of individual bit positions.

24. The method of claim 19, comprising:
determining when to adjust the one or more of the programming voltages based on a predetermined number of writes, reads, or both.

25. The method of claim 19, comprising:
storing the programming voltages, and any adjustments thereto, in a memory.

26. The method of claim 19, wherein the memory cells include flash memory cells.

* * * * *